United States Patent [19]

Naini

[11] Patent Number: 5,523,961
[45] Date of Patent: Jun. 4, 1996

[54] CONVERTING BIASED EXPONENTS FROM SINGLE/DOUBLE PRECISION TO EXTENDED PRECISION WITHOUT REQUIRING AN ADDER

[75] Inventor: Ajay Naini, Plano, Tex.

[73] Assignee: Cyrix Corporation, Richardson, Tex.

[21] Appl. No.: 330,776

[22] Filed: Oct. 28, 1994

[51] Int. Cl.$^6$ .................................. G06F 7/00; G06F 7/38
[52] U.S. Cl. ........................................ 364/715.03; 364/748
[58] Field of Search ............................... 364/715.03, 748

[56] References Cited

U.S. PATENT DOCUMENTS

| | | |
|---|---|---|
| 3,389,379 | 6/1968 | Erickson et al. . |
| 4,831,575 | 5/1989 | Kuroda ........................... 364/715.03 X |
| 4,949,291 | 8/1990 | Saini ................................... 364/715.03 |
| 5,268,855 | 12/1993 | Mason et al. ................... 364/715.03 X |

Primary Examiner—Tan V. Mai
Attorney, Agent, or Firm—Andrew S. Viger; John L. Maxin

[57] ABSTRACT

Exponent conversion logic implements floating point exponent conversion of single/double precision to an extended format (IEEE 754 standard), such as in the floating point unit of an x86 processor. The SP (single precision)/DP (double precision) to EP (extended precision exponent conversion technique avoids using an adder (with the attendant propagation delay). For SP exponents (8 bit), the exponent conversion logic implements conversion to EP format (15 bits) as follows (FIG. 3a): (a) transferring the 7 LSB (least significant bits) of the SP exponent (41) as the corresponding 7 LSBs of the EP format (42), (b) inverting the MSB (most significant bit) of the SP exponent and using it as the 7 next most significant bits of the EP format, and (c) transferring the MSB of the SP exponent of the MSB of the EP. The operation for converting DP exponents (11 bits) to EP format is analogous. The same exponent conversion techniques are used to reconvert extended format exponents to single and double precision exponents.

13 Claims, 3 Drawing Sheets

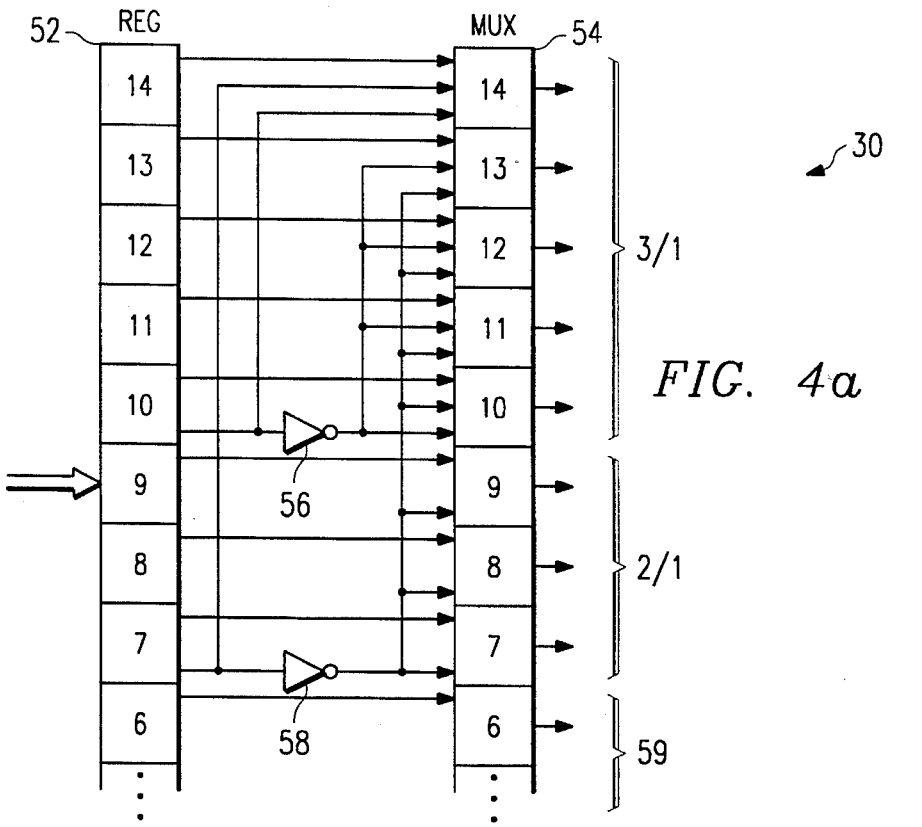
*FIG. 4a*
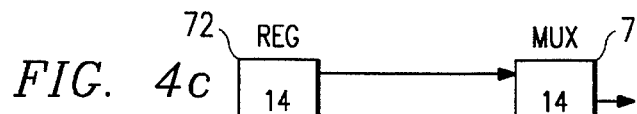
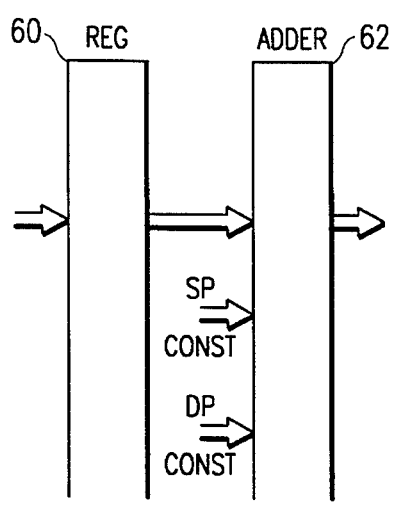
*FIG. 4b*
*(PRIOR ART)*
*FIG. 4c*

CONVERTING BIASED EXPONENTS FROM SINGLE/DOUBLE PRECISION TO EXTENDED PRECISION WITHOUT REQUIRING AN ADDER

BACKGROUND

1. Technical Field

The invention relates generally to data processing systems (Class 364), and more particularly relates to performing floating point computations on exponents (Subclasses 748 and 753).

In even greater particularity, the invention relates to the conversion of biased exponents from single/double precision to extended precision. In an exemplary embodiment, the conversion technique is implemented in the FPU of a 486- class microprocessor where the FPU performs floating point computation compatible with the IEEE 754 standard.

2. Related Art

The IEEE 754 Standard For Binary Floating Point Arithmetic defines four basic formats: Single, Single Extended, Double, and Double Extended. These formats are defined by a format width (total number of bits), an exponent width (bits of exponent), and an exponent bias—each format includes a leading sign bit.

|                  | Format Width | Exp Width | Bias        |
|------------------|--------------|-----------|-------------|
| Single           | 32           | 8         | +127        |
| Single Extended  | ≧43          | ≧11       | Unspecified |
| Double           | 64           | 11        | +1023       |
| Double Extended  | ≧79          | ≧15       | Unspecified |

Microprocessors commonly include a separate floating point unit (FPU) to perform floating point computations using floating point formatted data—the microprocessor core routes all floating point instructions to the FPU for execution. Internal to the FPU, computations are typically performed using the extended format to allow for greater accuracy in computation (i.e., reducing accumulated rounding error).

Without limiting the scope of the invention, this background information is provided in the context of a specific problem to which the invention has application: high performance conversion of single and double precision formatted biased exponents to corresponding extended biased exponents.

In executing a floating point instruction, the microprocessor core supplies the FPU with instruction opcode and operand data. Operand data is supplied in the data format used by the microprocessor—current 32-bit x86 microprocessors (386, 486, 586), can supply floating point operands in single precision (32 bit), double precision (64 bit), or extended (80 bit) formats.

In the FPU, SP (single precision) and DP (double precision) floating point operands are converted to the extended (80 bit) format for internal use in performing floating point computations. After the floating point computation is complete, the floating point result can then be converted from extended to corresponding SP or DP format in a final rounding operation.

Note that the IEEE Standard specifies the exponent formats for single and double precision (8 and 11 its respectively), but only specifies a minimum exponent range for extended formats (≧11 and 15 bits respectively). For the x86 architecture, the exponent range for the extended format used for both SP and DP is 15 bits.

Converting SP and DP format operands to the corresponding internal extended format involves converting both the exponent and the fraction portions.

Exponents are biased to allow magnitude comparisons to be performed using integer comparators (in addition, zero is represented as a number of all zeros). While the IEEE Standard does not specify the bias factor to be used with the extended format, the common approach is to use a bias of +16383.

Current FPU implementations of biased exponent conversion hardware use an adder—the adder accomplishes the conversion by subtracting an exponent bias for SP/DP, and adding the bias for extended—to convert SP to extended the bias is +3F80(hex), and to convert DP to extended the bias is +3C00(hex). See, for example, U.S. Pat. No. 4,949,291 entitled "Apparatus and Method for Converting Floating Point Data Formats In A Microprocessor" which describes a conventional approach to exponent conversion using an adder to add a conversion constant obtained from a constant ROM. This addition/conversion operation requires propagation through the adder.

Reducing the delay associated with the addition operation in converting to/form biased extended exponent formats would increase FPU performance.

SUMMARY

An object of the invention is to provide an improved exponent conversion technique that avoids the propagation delay associated with exponent conversion implementations that use adders.

This and other objects of the invention is achieved by exponent conversion circuitry that converts an input format biased exponent of x bits into a corresponding extended format biased exponent of y bits (where y>x).

In one aspect of the invention, the exponent conversion circuitry includes (a) input circuitry that receives an input format exponent of x bits; and (b) conversion circuitry that converts the input format exponent into a corresponding extended format exponent. The conversion circuitry includes inverter circuitry that is operable to invert he MSB of the input format exponent.

To perform exponent conversion, the conversion circuitry (a) transfers x-1 LSBs of the input format exponent to corresponding LSBs of the extended format exponent, (b) using the inverter circuitry, transfers the inverted MSB of the input format exponent to each of y-x-1 bits more significant than the x-1 LSBs of the extended format exponent, and (c) transfers the MSB of the input format biased exponent to the MSB of the extended format biased exponent.

Thus, the exponent conversion circuitry provides a converted extended format exponent having (a) x-1 LSBs derived from the corresponding LSBs of the input format biased exponent, (b) x-y-1 next LSBs derived from the inverse of the MSB of the input format biased exponent, and (c) an MSB corresponding to the MSB of the input format biased exponent.

In other aspects of the invention, the input format biased exponent comprises either or both (a) a single precision format of 8 bits which is converted to an extended format exponent of 15 bits, or (b) a double precision format of 11 bits which is converted to an extended format exponent of 15 bits.

The conversion circuitry is implemented using multiplexer circuitry with three sections: (a) a pass-through section, (b) a 2/1 mux section, and (c) an MSB mux section. The pass-through section is coupled to receive from the input circuitry, the x-1 LSBs of the input data corresponding to the x-1 LSBs of the input format exponent. The 2/1 mux section includes y-x-1 2/1 multiplexers, each coupled to receive (i) from the input circuitry, a corresponding one of the y-x-1 next LSBs of the input data, and (ii) from the inverter circuitry, a corresponding inverted MSB of the input format exponent. The MSB mux section includes a 2/1 multiplexer coupled to receive from the input circuitry (i) the MSB of the input data format, and (ii) the MSB the input format exponent. The multiplexer circuit is operable to select between (a) passing through input data of y bits, and (b) converting an input format exponent to an extended format exponent.

Embodiments of the invention may be implemented to realize one or more of the following technical advantages. The exponent conversion circuitry implements single/double precision conversion to extended format without using an adder, thereby avoiding the propagation delay in propagating through the adder. The exponent conversion circuitry can be implemented with two inverters, some multiplexers, and associated routing wires. The result is an improved exponent conversion technique for floating point processing.

For a more complete understanding of the invention, and for further features and advantages, reference is now made to the Detailed Description of an exemplary embodiment of the invention, together with the accompanying Drawings, it being understood that the invention encompasses any modifications or alternative embodiments that fall within the scope of the claims.

DRAWINGS

FIG. 4a illustrates an exemplary logic implementation of the exponent conversion circuitry.

FIG. 4b illustrates the prior art conversion circuitry using an adder.

FIG. 4c illustrates an alternate embodiment of the conversion circuitry that converts only single precision format biased exponents.

DETAILED DESCRIPTION

The detailed description of an exemplary embodiment of the exponent conversion circuitry is organized as follows:

1. Floating Point Processor
2. Exponent Conversion Circuitry
   2.1. Exponent Conversion Technique
   2.2. Exemplary Logic Implementation
   Conclusion This organizational outline, and the corresponding headings, are used in this Detailed Description for convenience of reference only.

The exemplary exponent conversion circuitry is implemented in the FPU of a 486-class microprocessor where the FPU performs floating point computations compatible with the IEEE 754 Standard For Binary Floating Point Arithmetic. Detailed descriptions of conventional or known aspects of microprocessor systems are omitted so as to not obscure the description of the invention with unnecessary detail. In particular, terminology specific to the x86 microprocessor architecture (such as register names, signal nomenclature, addressing modes, pinout definition, etc.) is known to practitioners in the microprocessor field, as is the basic design and operation of such microprocessors and of computer systems based on them.

The exemplary exponent conversion circuitry is used to convert single/double precision (SP/DP) format biased exponents to corresponding extended format biased exponents. References to exponent formats in this Detailed Description are understood to mean biased exponents unless unbiased exponents are specifically indicated.

1. Floating Point Processor

Figure 1:
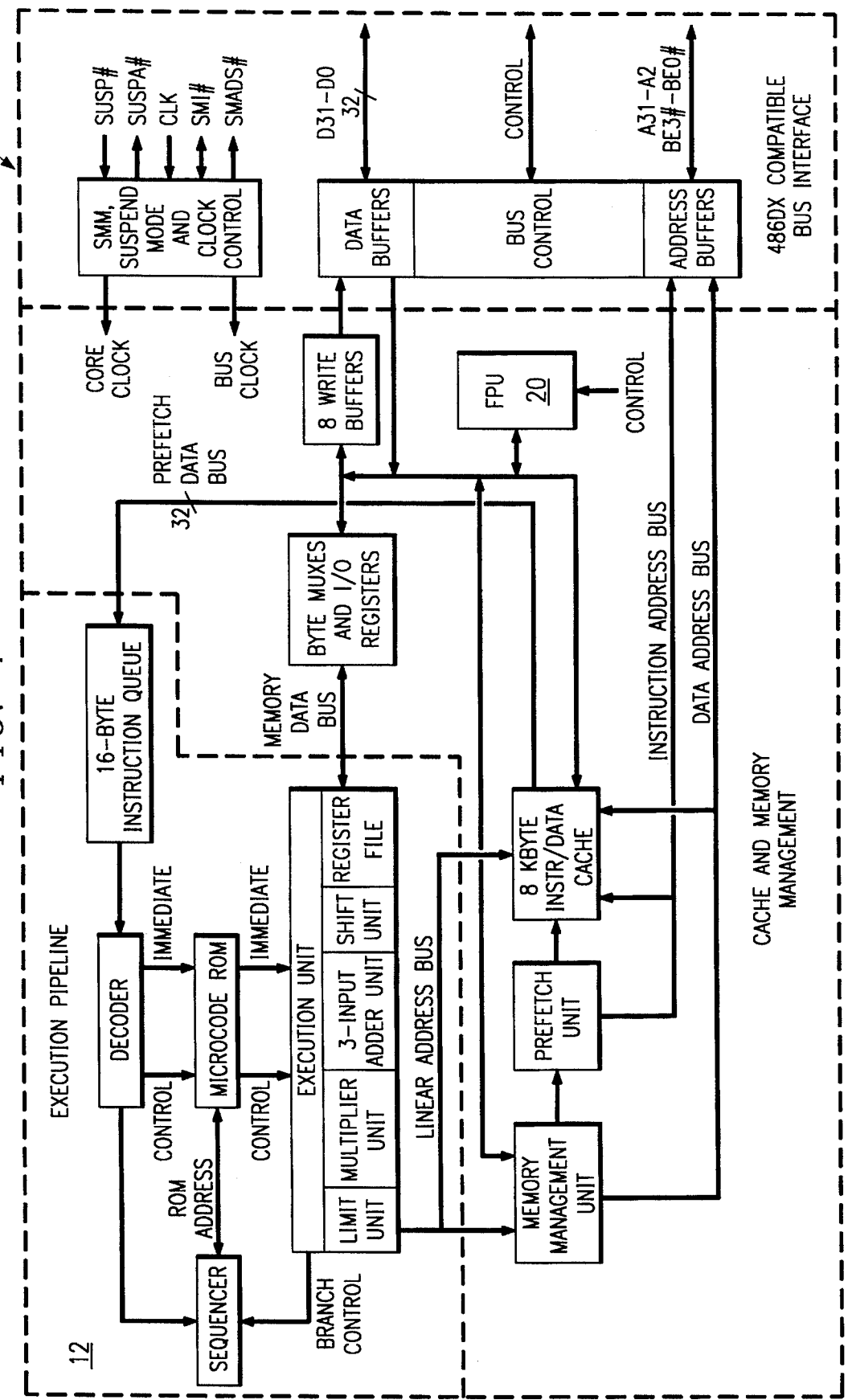
FIG. 1 illustrates an exemplary microprocessor including a floating point unit.

FIG. 1 illustrates an exemplary microprocessor including a floating point unit (FPU). Microprocessor 10 includes an execution pipeline core 12—floating point instructions are issued to FPU 20.

Floating point operands are in either single precision (32 bit or one Dword), double precision (64 bit or one Qword), or extended (80 bit) format. For SP, the biased exponent is 8 bits (with a bias of +127). For DP, the biased exponent is 11 bits (with a bias of +1023).

In accordance with IEE 754, for floating point computations, the FPU converts SP and DP floating point operands to an extended format with a biased exponent of 15 bits (using a bias of +16383).

Figure 2:
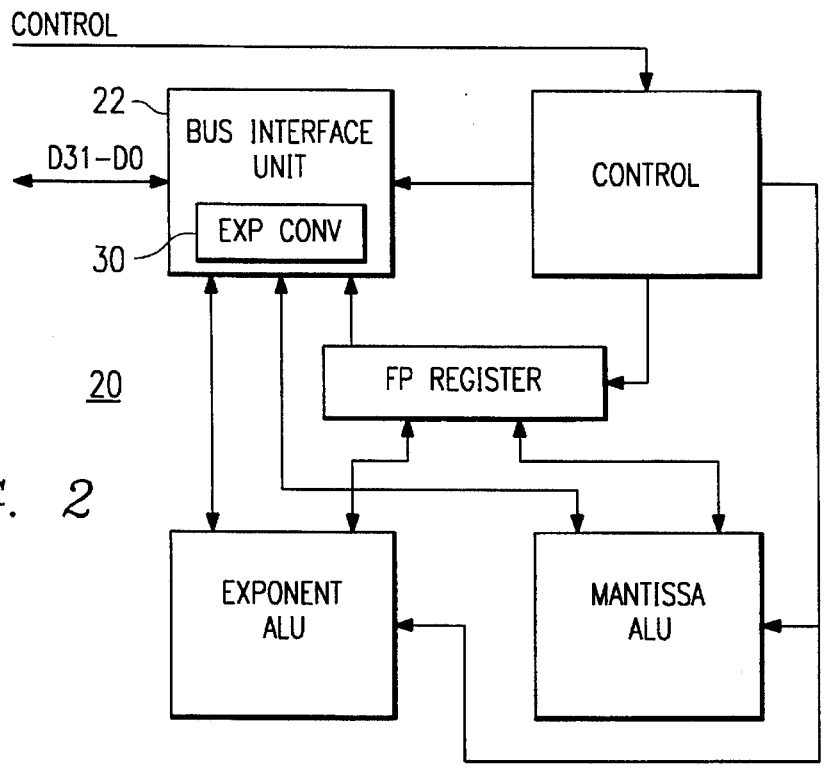
FIG. 2 illustrates an exemplary FPU, including exponent conversion logic.

FIG. 2 illustrates an exemplary FPU 20, including exponent conversion logic. The FPU includes a bus interface unit 22 that interfaces to a 32 bit system data bus. Floating point operands in either SP, DP, or extended format are supplied to the FPU over the system data bus.

SP and DP floating point operands are converted to the extended format. In particular, exponent conversion logic 30 is included in the bus interface unit for converting SP/DP exponents to extended format in accordance with the invention—floating point operands received in extended format are passed through without conversion.

Floating point results are supplied to the microprocessor (not shown) through the bus interface unit, where reconversion from extended to SP/DP format is selectively performed.

2. Exponent Conversion Circuitry

The exemplary exponent conversion circuitry converts single and double precision format exponents to the corresponding extended precision format, which in each case is 15 bits.

Figure 3A:
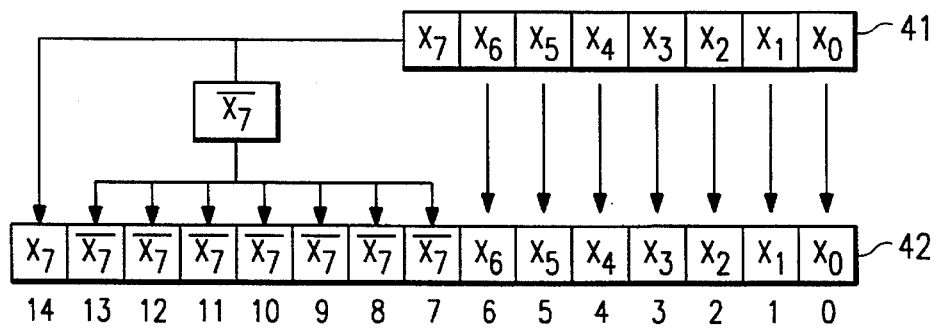
FIGS. 3a and 3b illustrate the exponent conversion technique according to the invention for both (3a) single precision, and (3b) double precision formats for biased exponents.
Figure 3B:
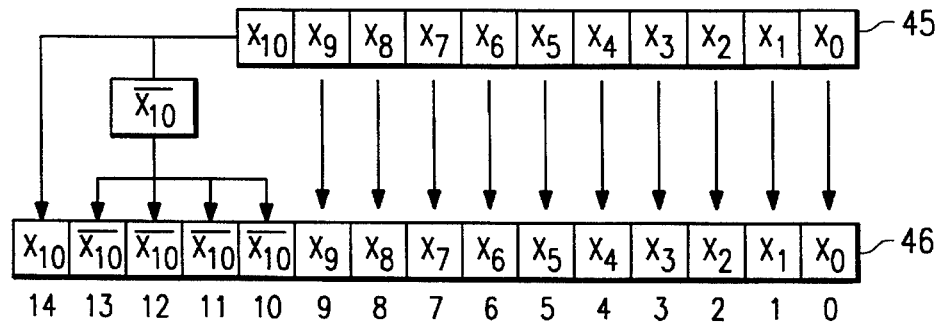

FIGS. 3a and 3b illustrate the exponent conversion technique according to the invention.

2.1. Exponent Conversion Technique

FIG. 3a illustrates the exemplary exponent conversion technique for single precision (8 bit) exponents. The SP-to-extended exponent conversion technique involves: (a) transferring the 7 LSP (least significant bits) of the SP exponent 41 as the corresponding 7 LSBs of the extended format exponent 42, (b) inverting the MSB (most significant bit) of the SP exponent and using it as the 7 next most significant bits of the extended format exponent, and (c) transferring the MSB of the SP format exponent as the MSB of the extended format exponent. The final extended format exponent is 15 bits.

FIG. 3b illustrates the exemplary exponent conversion technique for double precision (11 bits) exponents, which is analogous to the conversion technique for single precision exponents. Specifically, the DP-to-extended exponent conversion technique involves: (a) transferring the 10 LSB of the DP exponent 45 as the corresponding 10 LSBs of the extended format exponent 46, (b) inverting the MSB of the DP exponent and using it as the 4 next most significant bits of the extended format exponent, and (c) transferring the MSB of the DP format exponent as the MSB of the extended format exponent. The final extended format exponent is 15 bits.

The same exponent conversion techniques are used to reconvert extended format exponents to single and double precision exponents.

2.2. Exemplary Logic Implementation

FIG. 4a illustrates an exemplary logic implementation of the exponent conversion circuitry for both SP and DP formats. The exponent conversion circuitry 30 includes an input/output register 52 and a conversion multiplexer 54, together with inverters 56 and 58.

For the exemplary embodiment, the input/output register is a 15 bit register coupled to receive single precision (8 bit), double precision (11 bit), and extended format (15 bit) exponent values extended format exponents are passed through without conversion.

Each bit of the input/output register has associated with it a corresponding output circuit (multiplexer or straight pass through) of the multiplexer 54. The bits of the input/output register are coupled to corresponding output circuits of the multiplexer, except that [7] and [10] of the input/output register are coupled respectively through inverters 56 and 58 to the corresponding output circuits of the multiplexer.

The multiplexer 54 is configured into three multiplexer sections:(a) a pass through section 59, (b) a 2/1 mux section, and (c) a 3/1 mux section. The pass through section merely passes through the 7 LSBs [6:0] from the input/output register 52.

The 2/1 mux section includes three 2/1 multiplexers (output circuits). Each 2/1 multiplexer has two inputs: (a) a corresponding bit of the next three LSBs [7:9] of the input/output register (pass through mode), and (b) the inverse of bit [7] of the input/output register (corresponding to the MSB of a single precision exponent).

The 3/1 multiplexer section includes five 3/1 multiplexers. Four of these multiplexers each receives as inputs: (a) a corresponding bit of the next four LSBs [10:13] of the input/output register (pass through mode), (b) the inverse of bit [7] of the input/output register, and (c) the inverse of bit [10] of the input/output register (corresponding to the MSB of a double precision exponent). The fifth multiplexer receives as inputs: (a) the corresponding bit [14] of the input/output register (pass through mode), (b) bit [7] of the input/output register, and (c) bit [10] of the input/output register.

Conventional selection logic (not shown) is used to select the appropriate outputs from the multiplexer 54. Under appropriate control, the multiplexer can be used to: (a) pass through a 15 bit extended format exponent loaded into the input/output register 52, or (b) convert an SP/DP exponent to extended format in accordance with aspects of the invention.

In operation, the multiplexer 54 is used to implement the exponent conversion technique described in Section 2.1.

For SP exponents, the SP (8 bits) exponent is first loaded into the input/output register 52, i.e., into locations (7:0). Multiplexer 54 is used to select the appropriate output bits to provide a corresponding 15 bit extended format exponent according to the SP exponent conversion technique of the invention. Specifically, (a) the seven LSBs [7:0] of the extended exponent are obtained by passing through pass through section 59 the corresponding seven LSBs of the SP exponent from the input/output register, (b) the next three LSBs [9:7] of the extended exponent are obtained by selecting as the outputs from the corresponding three 2/1 multiplexers in the 2/1 mux section the inverse of the MSB [7] of the SP exponent, (c) the next four LSBs [13:10] of the extended exponent are obtained by selecting as the outputs from the corresponding four 3/1 multiplexers in the 3/1 mux section the inverse of the MSB [7] of the SP exponent, and (d) the MSB [14] of the extended exponent is obtained by selecting as the output from the corresponding 3/1 multiplexer the MSB [7] of the SP exponent.

For DP exponents, the DP precision (11 bits) exponent is first loaded into the input/output register 52, i.e., into locations [11:0]. Multiplexer 54 is used to select the appropriate output bits to provide a corresponding 15 bit extended format exponent according to the double precision exponent conversion technique of the invention. Specifically, (a) the seven LSBs [7:0] of the extended exponent are obtained by passing through pass through section 59 the corresponding seven LSBs of the DP exponent from the input/output register, (b) the next three LSBs [9:7] of the extended exponent are obtained by selecting as the outputs from the corresponding three 2/1 multiplexers in the 2/1 mux section the corresponding pass through LSBs [9:7] of the DP exponent from the input/output register, (c) the next four LSBs [13:10] of the extended exponent are obtained by selecting as the outputs from the corresponding four 3/1 multiplexers in the 3/1 mux section the inverse of the MSB [10] of the DP exponent, and (d) the MSB [14] of the extended exponent is obtained by selecting as the output from the corresponding 3/1 multiplexer the MSB [10] of the DP exponent.

In an analogous manner, the exponent conversion circuitry can also be used to convert extended format exponents to single or double precision exponents. Specifically, for single precision exponents bits [6:0 are passed through and MSB [15] is shifted to bit [7] of the input/output register. For double precision exponents, bits [10:0] are passed through and MSB [15] is shifted to bit [11] of the input/ output register.

In this manner, single and double precision exponent conversion to extended format is accomplished using the multiplexer 54 together with inverters 56 and 58. This exponent conversion circuitry avoids the delay associated with prior art conversion schemes.

FIG. 4b illustrates prior art conversion circuitry using an adder 62. The adder implements conversion by adding a constant bias of: (a) for SP, 3F80(hex), and (b) for DP, 3C00(hex). Associated with such conversion is the propagation delay through the adder.

FIG. 4c illustrates an alternate embodiment of the conversion circuitry that converts only single precision format biased exponents. Thus, the exponent conversion circuit 30 includes an input/output register 72 and a multiplexer 74, together with an inverter 76.

The multiplexer 74 is configured into two sections: (a) a pass through section 79, and (b) a 2/1 mux section. The pass through section merely passes through the 7 LSBs [6:0] from the input/output register 72.

The 2/1 mux section includes eight 2/1 multiplexers (output circuits). Each 2/1 multiplexer has two inputs. For each of the seven 2/1 multiplexers corresponding to the next seven LSBs [13:7] of the input/output register, the inputs are: (a) a corresponding bit of the next seven LSBs [13:7] of the input/output register (pass through mode), and (b) the inverse of the bit [7] of the input/output register 72 (corresponding to the MSB of a single precision exponent).

The eighth multiplexer receives as inputs: (a) the corresponding bit [14] of the input/output register (pass through mode), and (b) bit [7] of the input/output register (the MSB of the SP exponent.

Again, conventional selection logic (not shown) is used to select the appropriate outputs from the multiplexer 74.

In operation, the multiplexer 74 is used to implement the exponent conversion technique described in Section 2.1 for single precision exponents.

The SP (8 bits) exponent is first loaded into the input/output register 72, i.e., into locations (7:0]. Multiplexer 74 is used to select the appropriate output bits to provide a corresponding 15 bit extended format exponent according to the SP exponent conversion technique of the invention. Specifically, (a) the seven LSBs [7:0] of the extended exponent are obtained by passing through pas through section 59 the corresponding seven LSBs of the SP exponent from the input/output register, (b) the next seven LSBs [13:7] of the extended exponent are obtained by selecting as the outputs from the corresponding seven 2/1 multiplexers the inverse of the MSB [7] of the SP exponent, and (c) the MSB [14] of the extended exponent is obtained by selecting as the output from the corresponding 2/1 multiplexer the MSB [7] of the SP exponent.

3. Conclusive

Although the Detailed Description of the invention has been directed to certain exemplary embodiments, various modifications of these embodiments, as well as alternative embodiments, will be suggested to those skilled in the art.

For example, specific register structures, mappings, bit assignments, and other implementation details are set forth solely for purposes of providing a detailed description of the invention.

Also, references in the claims to single, double, and extended data formats (and the corresponding bit sizes) are not meant to be limiting, but rather are intended to designate blocks of data of arbitrary size, except that the extended format for a data format is a predetermined number of bits larger than data format.

Moreover, various modifications based on trade-offs between hardware and software logic will be apparent to those skilled in the art.

The invention encompasses any modifications or alternative embodiments that fall within the scope of the claims.

I claim:

1. In a floating point processor in which an input data format is converted into a corresponding extended format, exponent conversion circuitry for converting an input format biased exponent of x bits into a corresponding extended format biased exponent of y bits, where y>x, comprising:

(a) input circuitry that receives an input format biased exponent of x bits;

(b) conversion circuitry that converts the input format biased exponent into a corresponding extended format biased exponent;

(c) the conversion circuitry transferring x-1 LSBs of the input format biased exponent to corresponding LSBs of the extended format biased exponent;

(d) the conversion circuitry including inverter circuitry that inverts the MSB of the input format biased exponent, and transfers such inverted MSB to each of y-x-1 bits more significant than the x-1 LSBs of the extended format biased exponent; and (e) the conversion circuitry transferring the MSB of the input format biased exponent to the MSB of the extended format biased exponent;

(f) thereby providing a converted extended format biased exponent having (i) x-1 LSBs derived from the corresponding LSBs of the input format biased exponent, (ii) x-y-1 next LSBs derived from the inverse of the MSB of the input format biased exponent, and (iii) an MSB corresponding to the MSB of the input format biased exponent.

2. The exponent conversion circuitry of claim 1, wherein the input format biased exponent comprises a single precision format of 8 bits, and the extended format biased exponent comprises an extended format of 15 bits.

3. The exponent conversion circuitry of claim 1, wherein the input format biased exponent comprises a double precision format of 11 bits, and the extended format biased exponent comprises an extended format of 15 bits.

4. The exponent conversion circuitry of claim 1, wherein the input circuitry comprises an input/output register.

5. The exponent conversion circuitry of claim 1, wherein the input circuitry is capable of receiving input data of at least y bits including x-1 LSBs y-x-1 next LSBs, and an MSB, further comprising:

(a) multiplexer circuitry with three sections: (i) a pass-through section, (ii) a 2/1 mux section, and (iii) an MSB mux section;

(b) the pass-through section being coupled to receive from the input circuitry, the x-1 LSBs of the input data corresponding to the x-1 LSBs of the input format biased exponent;

(c) the 2/1 mux section including y-x-1 2/1 multiplexers, each being coupled to receive a (i) from the input circuitry, a corresponding one of the y-x-1 next LSBs of the input data, and (ii) from the inverter circuitry, a corresponding inverted MSB of the input format biased exponent, and (d) the MSB mux section including a 2/1 multiplexer coupled to receive from the input circuitry (i) the MSB of the input data format, and (ii) the MSB the input format biased exponent;

(e) such that the multiplexer circuit is operable to select between (i) passing through input data of y bits, and (ii) converting an input format biased exponent to an extended format biased exponent.

6. In a floating point processor in which an input data format is converted into a corresponding extended format, exponent conversion circuitry for converting an input format biased exponent of x bits into a corresponding extended format biased exponent of y bits, where y>x, comprising:

(a) input means for receiving an input format biased exponent of x bits;

(b) conversion means for converting the input format biased exponent into a corresponding extended format biased exponent;

(c) the conversion means transferring x-1 LSBs of the input format biased exponent to corresponding LSBs of the extended format biased exponent;

(d) the conversion means including inverter means for inverting the MSB of the input format biased exponent, and transferring such inverted MSB to each of y-x-1 bits more significant than the x-1 LSBs of the extended format biased exponent; and (e) the conversion means transferring the MSB of the input format biased exponent to the MSB of the extended format biased exponent;

(f) thereby providing a converted extended format biased exponent having (i) x-1 LSBs derived from the corresponding LSBs of the input format biased exponent, (ii) x-y-1 next LSBs derived from the inverse of the MSB of the input format biased exponent, and (iii) an MSB corresponding to the MSB of the input format biased exponent.

7. The exponent conversion circuitry of claim 6, wherein the input format biased exponent comprises a single precision format of 8 bits, and the extended format biased exponent comprises an extended format of 15 bits.

8. The exponent conversion circuitry of claim 6, wherein the input format biased exponent comprises a double precision format of 11 bits, and the extended format biased exponent comprises an extended format of 15 bits.

9. The exponent conversion circuitry of claim 6, wherein the input means comprises an input/output register.

10. The exponent conversion circuitry of claim 6, wherein the input means is capable of receiving input data of at least y bits including x-1 LSBs y-x-1 next LSBs and an MSB, further comprising:

(a) multiplexer circuitry with three sections: (i) a pass-through section, (ii) a 2/1 mux section, and (iii) an MSB mux section;

(b) the pass-through section being coupled to receive from the input circuitry, the x-1 LSBs of the input data corresponding to the x-1 LSBs of the input format biased exponent;

(c) the 2/1 mux section including y-x-1 2/1 multiplexers, each being coupled to receive a (i) from the input circuitry, a corresponding one of the y-x-1 next LSBs of the input data, and (ii) from the inverter circuitry, a corresponding inverted MSB of input format biased exponent; and (d) the MSB mux section including a 2/1 multiplexer coupled to receive from the input circuitry (i) the MSB of the input data format, and (ii) the MSB the input format biased exponent;

(e) such that the multiplexer circuit is operable to select between (i) passing through input data of y bits, and (ii) converting an input format biased exponent to an extended format biased exponent.

11. A method of converting an input format biased exponent of x bits into a corresponding extended format biased exponent of y bits, where y>x, comprising the steps:

(a) receiving an input format biased exponent of x bits;

(b) converting the input format biased exponent into a corresponding extended format biased exponent by;

(i) transferring x-1 LSBs of the input format biased exponent to corresponding LSBs of the extended format biased exponent;

(ii) inverting the MSB of the input format biased exponent, and transferring such inverted MSB to each of y-x-1 bits more significant than the x-1 LSBs of the extended format biased exponent; and (iii) transferring the MSB of the input format biased exponent to the MSB of the extended format biased exponent;

(c) thereby providing a converted extended format biased exponent having (i) x-1 LSBs derived from the corresponding LSBs of the input format biased exponent, (ii) x-y-1 next LSBs derived from the inverse of the MSB of the input format biased exponent, and (iii) an MSB corresponding to the MSB of the input format biased exponent.

12. The exponent conversion circuitry of claim 11, wherein the input format biased exponent comprises a single precision format of 8 bits, and the extended format biased exponent comprises an extended format of 15 bits.

13. The exponent conversion circuitry of claim 11, wherein the input format biased exponent comprises a double precision format of 11 bits, and the extended format biased exponent comprises an extended format of 15 bits.

* * * * *